United States Patent
Ciani et al.

(10) Patent No.: US 11,674,077 B2
(45) Date of Patent: Jun. 13, 2023

(54) PROCESS FOR THE POST-DEPOSITION TREAMENT OF COLLOIDAL QUANTUM DOT PHOTODETECTOR FILMS TO IMPROVE PERFORMANCE BY USING HYDROGEN PEROXIDE

(71) Applicants: Anthony Joseph Ciani, Palatine, IL (US); Richard Edward Pimpinella, Oswego, IL (US); Christopher Frank Buurma, Bolingbrook, IL (US); Jered Feldman, Chicago, IL (US); Christoph H. Grein, Wheaton, IL (US)

(72) Inventors: Anthony Joseph Ciani, Palatine, IL (US); Richard Edward Pimpinella, Oswego, IL (US); Christopher Frank Buurma, Bolingbrook, IL (US); Jered Feldman, Chicago, IL (US); Christoph H. Grein, Wheaton, IL (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 203 days.

(21) Appl. No.: 16/734,222

(22) Filed: Jan. 3, 2020

(65) Prior Publication Data
US 2021/0207023 A1   Jul. 8, 2021

(51) Int. Cl.
*H01L 31/18*    (2006.01)
*B82Y 15/00*    (2011.01)
*H01L 31/0352*  (2006.01)
*C09K 11/02*    (2006.01)
*B82Y 30/00*    (2011.01)
*B82Y 20/00*    (2011.01)

(52) U.S. Cl.
CPC .... *C09K 11/025* (2013.01); *H01L 31/035218* (2013.01); *H01L 31/18* (2013.01); *B82Y 15/00* (2013.01); *B82Y 20/00* (2013.01); *B82Y 30/00* (2013.01)

(58) Field of Classification Search
CPC ......... B82Y 15/00; B82Y 20/00; B82Y 30/00; H01L 31/0352; C09K 11/025
See application file for complete search history.

(56) References Cited

U.S. PATENT DOCUMENTS

| | | |
|---|---|---|
| 5,300,915 A | 4/1994 | Higashi et al. |
| 5,512,748 A | 4/1996 | Hanson |
| 5,589,688 A | 12/1996 | Kimura et al. |
| 5,912,464 A | 6/1999 | Vilain et al. |
| 6,111,254 A | 8/2000 | Eden |
| 6,906,326 B2 | 6/2005 | Koch et al. |
| 7,742,322 B2 | 6/2010 | Sargent et al. |
| 7,746,681 B2 | 6/2010 | Sargent et al. |
| 7,881,091 B2 | 2/2011 | Sagent et al. |
| 3,023,306 A1 | 9/2011 | Sargent et al. |
| 8,054,671 B2 | 11/2011 | Sagent et al. |
| 9,209,331 B2 | 12/2015 | Ivanov et al. |
| 9,373,736 B2 | 6/2016 | Sagent et al. |
| 2008/0220982 A1* | 9/2008 | Vu .......... B82Y 15/00 506/13 |
| 2012/0274231 A1 | 11/2012 | Tu et al. |
| 2012/0292594 A1* | 11/2012 | Zhou ...... H01L 51/502 977/773 |
| 2014/0306179 A1 | 11/2014 | Demir et al. |
| 2015/0284318 A1* | 10/2015 | Zhao ........ G01N 33/5005 562/455 |
| 2018/0374975 A1* | 12/2018 | Ayon ............ C09K 11/025 |
| 2019/0013412 A1 | 1/2019 | Xie |
| 2020/0357939 A1* | 11/2020 | Law ................ H01L 31/0336 |

* cited by examiner

*Primary Examiner* — Scott B Geyer

(74) *Attorney, Agent, or Firm* — Erickson Law Group, PC

(57) ABSTRACT

A process for the post-deposition treatment of colloidal quantum dot films to improve photodetector performance. A colloidal quantum dot film is first deposited on a suitable substrate or device structure, given a ligand exchange, and then allowed to dry into a completed film. Next, a solution is prepared consisting of dilute $H_2O_2$ mixed with a polar solvent such as isopropyl alcohol solution. The prepared film and substrate are then immersed into the prepared solution over a set interval of time. After which, the film is removed and rinsed with solvent, then dried with clean $N_2$ gas. After this treatment, the colloidal quantum dot film is ready for use as a photodetector.

7 Claims, 1 Drawing Sheet

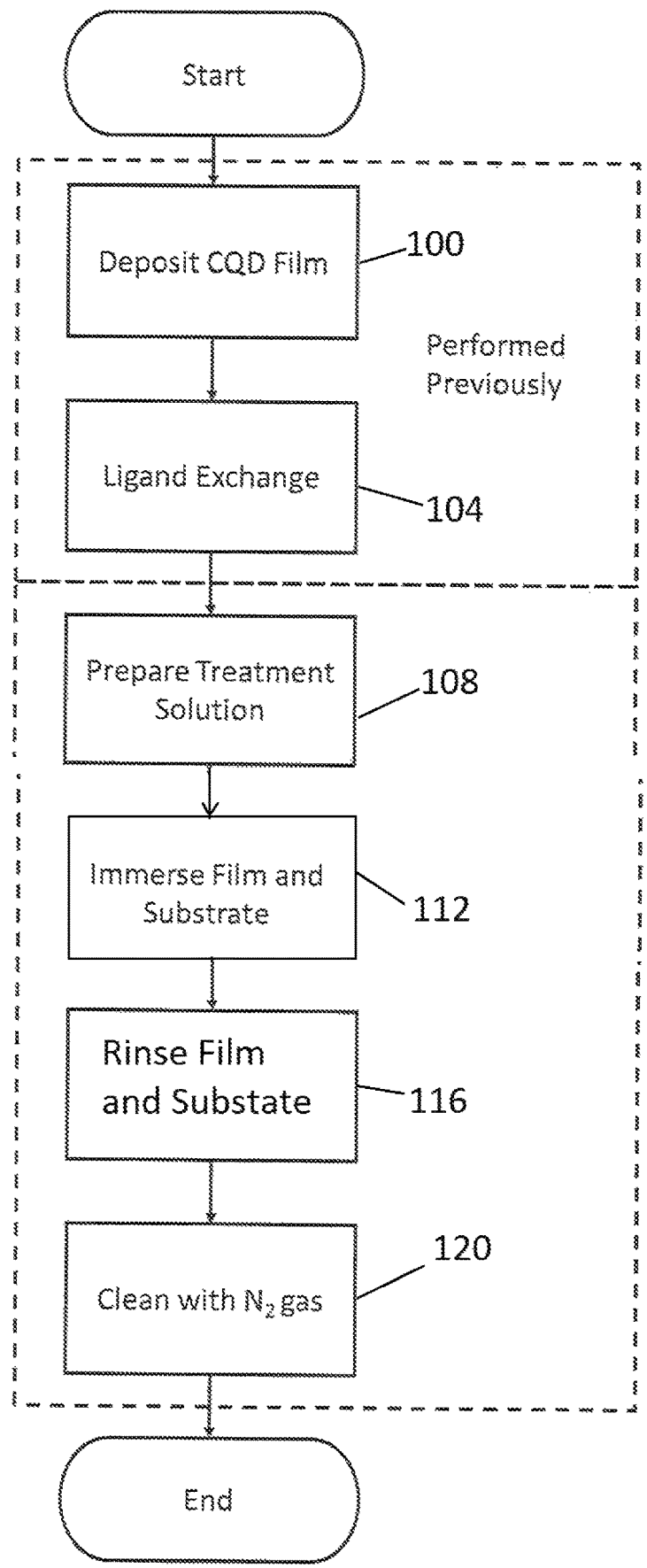

PROCESS FOR THE POST-DEPOSITION TREAMENT OF COLLOIDAL QUANTUM DOT PHOTODETECTOR FILMS TO IMPROVE PERFORMANCE BY USING HYDROGEN PEROXIDE

STATEMENT REGARDING FEDERALLY SPONSORED RESEARCH OR DEVELOPMENT

This invention was made with government support under US Government contract: D15PC00007 awarded by Department of Defense (Defense Advanced Research Projects Agency). The government has certain rights in the invention.

TECHNICAL FIELD

This invention generally relates to a process which is used after the deposition of a colloidal quantum dot film which utilizes wet chemistry techniques to improve the photodetector performance of the film. This technique can be used to improve a variety of quantum dot films composed of different materials with organic or inorganic ligands that may hinder performance. These quantum dot films to be improved are sensitive to infrared wavelengths of electromagnetic radiation.

BACKGROUND

Certain materials, material systems, material composites and material structures known collectively as photosensors or photodetectors are capable of producing a detectable change in electrical signal(s), such as a current or changing conductance when light or waves of electromagnetic radiation are absorbed by the photodetector. A photodetector often comprises a structure consisting of a conductive cathode in contact with a photoconductive material or photovoltaic junction and an anode contact. Electronic detection of photons is accomplished by applying an electrical bias voltage or electric field between the two electrodes (anode and cathode) of a photodetector, measuring the signal apparent in the photodetector and relating that signal to the intensity of the electromagnetic radiation incident on the detector. Further information of such photodetectors may be found in U.S. Pat. Nos. 5,912,464; 6,111,254; 5,300,915; 5,021,663; 5,512,748; and 5,589,688.

One such type of photodetector is a colloidal quantum dot (CQD) film. These films consist of small aggregates of material known as quantum dots which form particles on the scale of a few nanometers which are suspended in a suspending solution as a colloid before being treated, deposited, and then bonded to the deposition target substrate. These solutions are often comprised of a suspending organic or inorganic ligand or multiple ligands which prevent agglomeration and eventual sedimentation of the suspended nano-crystal quantum dots.

These quantum dots possess quantized allowable energies for the quantum mechanical electron states within each dot. Due to the quantum confinement imposed by each dot's restricted physical size, these energy states may not represent those found when they are made from the same materials in bulk. When a photon is intercepted by such a dot, it may be absorbed and excite an electron into another allowable quantum state within the dot. This excited electron may then move from its origination dot to any other dot in the film, via quantum mechanical tunneling, with a very strong preference for those in immediate physical proximity and energetic alignment. Excited electrons within a material in contact with conductive electrodes may then transit from the film and follow the new electrode path. When applying an external electric field or voltage bias through the CQD film, one can create preferred directions for this tunneling behavior and thus create an observed change in film conduction when many such excited electrons are present due to the exciting electromagnetic radiation, and thus radiation is detected. Further information on CQD films as photodetectors may be found in U.S. Pat. Nos. 7,746,681; 6,906,326; 7,742,322; 8,023,306; 7,881,091; 9,373,736; 8,054,671; and 9,209,331.

These photodetector films are deposited onto device structures, electronic circuits, host materials or other dot films known collectively as the 'substrate'. This deposition process can take many forms including simple drop-casting using the surface tension of the liquid to form droplets of known volume and dropping them onto the substrate, to ink-jet printing techniques, spin coating, forced pressure nozzles, and other common liquid deposition techniques.

After deposition, treatments are commonly performed which remove suspending ligands and excess unintended ionic and non-ionic compounds, molecules, undesirable atoms, non-doping extrinsic species, and chemical precursors known collectively as 'contaminants'. These treatments will also replenish, add or replace the ligands with those more suitable to its intended purpose of photodetection.

The present inventors have recognized that energy states which arise from any surviving contaminants, or from the ligands, may couple with the energy states within the confined quantum dots, leading to a decrease in photodetection performance and carrier loss. The present inventors have recognized that careful control of post-deposition treatments can significantly affect colloidal quantum dot film performance due to this possible carrier loss due to contaminants and undesirable energy states provided which interact with those states of the quantum dots.

SUMMARY

The present inventors have recognized that aggressive concentrations of oxidizing and reducing agents such as hydrogen peroxide can react with, consume, and eventually remove contaminants, or even replace the organic binding ligands in the film. The present inventors have recognized that these agents, however, when used under the wrong concentrations and times can similarly damage the CQD nano-crystal structures, remove desirable extrinsic atomic species or ligands, or cause the nano-crystals to agglomerate into grains, removing their quantum confinement.

Exemplary methods of the invention include one in which a colloidal quantum dot film is first deposited on a suitable substrate or device structure, given a ligand exchange, and then allowed to dry into a completed film. Any deposition process which leaves the CQD film exposed to further treatments would be suitable. Next, a solution is prepared consisting of dilute $H_2O_2$ mixed with a volume of a polar solvent such as isopropyl alcohol. Then, the CQD film and substrate are immersed within the prepared solution during a pre-selected treatment time, such as a duration which can range from 30 seconds to 120 seconds. The duration depends on the material system to be treated, the dilute concentration of $H_2O_2$, the thickness of the CQD film, and other factors. After the treatment time has elapsed, the film and substrate are removed from the solution, rinsed to remove any lingering solution and contaminants, and then blown dry using flowing clean inert $N_2$ gas. Any solvent or combination of solvents may be used in the $H_2O_2$ solution or as the rinse as long as it is compatible with the CQD film and substrate and is capable of removing unwanted polar and non-polar contaminants. Once dried, the film is ready for use in photodetection applications.

According to the exemplary method, a treatment solution is prepared which is composed of $H_2O_2$, water, and a polar or non-polar solvent; and is safe for use in standard chemical laboratory environments with proper protective equipment and training.

The CQD film can be deposited on a suitable substrate which may be device structure, electronic circuit, host material or other dot film referred to as the "substrate." The film is deposited using any appropriate means which leaves the film surface exposed to chemical treatments; and is otherwise untreated after deposition.

More specifically, a process to treat the film includes preparation of a container which will house the treatment reaction, capturing excess treatment solution and chemical waste from the process, but with sufficient volume to contain the film, substrate, and treatment solution. Completely immersing the CQD film and substrate for a given duration suitable to the photodetector film to ensure desired chemical processes have taken place to achieve the desirable result, preferably not to be less than 5 seconds. The rinsing procedure of the treated CQD film is immediately undertaken with inert polar or non-polar solvent flowing over the film and substrate, and captured for proper disposal. Finally, the use of flowing inert $N_2$ gas should be of sufficient purity not to introduce new contaminants while removing any lingering treatment solution or rinsing isopropyl alcohol. The disposal of the remaining treatment solution, excess runoff polar or non-polar solvents and other chemical waste should follow all local, state, and national safety standards.

Numerous other advantages and features of the present invention will become readily apparent from the following detailed description of the invention and the embodiments thereof, and from the accompanying drawings.

BRIEF DESCRIPTION OF THE DRAWINGS

FIG. 1 is a flowchart of an exemplary method of the present invention.

DETAILED DESCRIPTION

The exemplary method of the invention should maintain the energy states of the quantum dots by reducing any surviving contaminants, or from ligands which may couple with the energy states within the confined quantum dots, leading to an increase in photodetection performance. Colloidal quantum dot film performance can be increased due to reduction in carrier loss due to contaminants and undesirable energy states provided which would otherwise interact with those states of the quantum dots. Controlled concentrations of oxidizing and reducing agents such as hydrogen peroxide should react with, consume, and eventually remove contaminants, or even replace the organic binding ligands in the film. These agents, when used under the exemplary concentrations and times set forth herein should not damage the CQD nano-crystal structures, nor remove desirable extrinsic atomic species or ligands, nor cause the nano-crystals to agglomerate into grains, nor remove their quantum confinement.

While various embodiments of the present invention have been described, it should be understood that other modifications and alternatives can be made without departing from the spirit and scope of the invention which should be determined from the appended claims. It is to be understood that no limitation with respect to the specific apparatus illustrated herein is intended or should be inferred.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit this invention to the specific embodiments illustrated.

This invented process provides for a post-deposition treatment of a CQD film which can improve its electrical and optical performance. This process will follow the flowchart in FIG. 1, and each section marked with the corresponding number.

Initially, the CQD film to be treated is first deposited on a substrate in step 100 in any of a variety of ways using common present-day techniques, or new techniques yet unforeseen. The treatment solution may be tailored to the targeted material system to be improved, as well as altered to adjust for variations in thickness, surface uniformity, $H_2O_2$ concentration, suspected contaminants arising from the CQD solutions preparation or deposition, or other factors.

Next, in step 104 a ligand exchange is performed on the CQD film.

Example 1

After step 104, a post-deposition treatment process and treatment solution preparation for a deposited CQD film is performed as described below. It is preferred that listed steps be performed in an ISO Class 10/100 or superior clean room environment with suitably trained personnel.

In this embodiment and method of the invention, the CQD film can be comprised of HgTe quantum dots with an average diameter of 12 nm and has been deposited 3 μm thick through a drop-casting method on a silicon wafer with two electrical traces which can provide an electrical bias to the CQD film.

Preparation of the Treatment Solution

Given this material system, thickness, and expected surface uniformity, the solution will be prepared as follows. Listed volumes may be scaled up proportionally if a larger volume of solution is required.

In step 108, 0.5 mL of 30% dilute by volume $H_2O_2$ is added to 4.5 mL of de-ionized water. Next, this newly prepared 5 mL of 3.0% dilute $H_2O_2$ is added to 5 mL of isopropyl alcohol forming a 10 mL treatment solution 1.5% by volume $H_2O_2$.

Thus, the exemplary embodiment treatment solution for a CQD film, is composed of: $H_2O_2$, water, and a polar or non-polar solvent, wherein by volume, the $H_2O_2$ is about 1.5%; the water is about 48.5% and the solvent is about 50%.

In more general terms, the exemplary embodiment solution is prepared by providing a first volume of X mL of about 30% dilute by volume $H_2O_2$; adding the first volume to 9X mL of de-ionized water to provide a second volume of 10X mL; adding the second volume to 10X mL of isopropyl alcohol forming a 20X mL treatment solution of 1.5% by volume $H_2O_2$; wherein X is a number value, and wherein for example "9X" is X multiplied by 9.

Immersion of the CQD Film in the Solution

Next, in step 112, the treatment solution can be transferred to a treatment container which can accommodate the volume of the solution, the substrate and deposited CQD film. The treatment solution should be of sufficient volume to ensure that the substrate and CQD film are fully immersed in the solution for the duration of the treatment.

Next, the CQD film and substrate are entirely immersed within the solution for a treatment duration. For the given material system and thickness, a 60 second duration is used.

In step 116, after the treatment duration has elapsed, the CQD film and substrate are immediately removed and rinsed with excess isopropyl alcohol likely exceeding 50 mL of volume.

Cleaning of the Film and Disposal

After the rinse, in step 120, clean, room-temperature inert $N_2$ gas will be blown over the film and substrate, ensuring that no treatment solution or isopropyl alcohol remains on the film. The rinsed isopropyl and remaining treatment solution may then be properly disposed of using chemical disposal procedures.

The invention claimed is:

1. A method of treating a workpiece, comprising the steps of:
   providing a workpiece comprising a colloidal quantum dot (CQD) film deposited on a substrate, the substrate comprising a device structure, an electronic circuit, a host material or other dot film, the CQD film deposited leaving a film surface exposed to chemical treatments;
   providing a first volume of diluted $H_2O_2$;
   adding de-ionized water to provide a second volume;
   adding the second volume to isopropyl alcohol forming a treatment solution;
   immersing the workpiece into the treatment solution; and
   removing the workpiece from the treatment solution.

2. The method according to claim 1, comprising the further steps of:
   after the step of removing the workpiece, rinsing the workpiece with polar or non-polar solvent; and
   flowing inert $N_2$ gas over the CQD film.

3. The method according to claim 2, further defined by the step of:
   preparation of a container which will house the treatment reaction, capture excess treatment solution and chemical waste from the process, but with sufficient volume to contain the film, substrate, and treatment solution;
   wherein the step of immersing the workpiece into the treatment solution is further defined in that the CQD film and substrate are immersed for a given duration suitable to the photodetector film not to be less than 5 seconds;
   wherein the step of rinsing the workpiece with polar or non-polar solvent is further defined in that the CQD film is immediately rinsed with the inert polar or non-polar solvent flowing over the film and substrate;
   wherein the step of flowing inert $N_2$ gas over the CQD film is further defined in that the use of flowing inert $N_2$ gas is of sufficient purity not to introduce new contaminants and which is used to remove any lingering treatment solution or rinsing isopropyl alcohol.

4. A method of a post-deposition treatment of a colloidal quantum dot (CQD) film, comprising the steps of:
   providing a workpiece comprised of a CQD film deposited on a substrate;
   preparing a treatment solution by providing a first volume of X mL of 30% dilute by volume $H_2O_2$;
   adding the first volume to 9X mL of de-ionized water to provide a second volume of 10X mL;
   adding the second volume to 10X mL of isopropyl alcohol forming a 20X mL treatment solution 1.5% by volume $H_2O_2$;
   wherein X is a number value;
   immersing the workpiece into the treatment solution;
   removing the workpiece from the treatment solution; and
   rinsing the workpiece with excess isopropyl alcohol.

5. The method according to claim 4, wherein X equals about 0.5.

6. The method according to claim 4, wherein the step of immersing the workpiece into the treatment solution is further defined in that the workpiece is immersed in the treatment solution for about 60 seconds.

7. The method according to claim 4, comprising a further step of, after the workpiece is rinsed with isopropyl alcohol, blowing $N_2$ gas over the workpiece, until no treatment solution or isopropyl alcohol remains on the film.

* * * * *